(12) United States Patent
Franklin et al.

(10) Patent No.: US 7,655,496 B1
(45) Date of Patent: Feb. 2, 2010

(54) METAL LIFT-OFF SYSTEMS AND METHODS USING LIQUID SOLVENT AND FROZEN GAS

(75) Inventors: Patrick Franklin, Santa Barbara, CA (US); John J. Naughton, Idaho Falls, ID (US)

(73) Assignee: FLIR Systems, Inc., Wilsonville, OR (US)

( * ) Notice: Subject to any disclaimer, the term of this patent is extended or adjusted under 35 U.S.C. 154(b) by 0 days.

(21) Appl. No.: 11/831,823

(22) Filed: Jul. 31, 2007

(51) Int. Cl.
  *H01L 21/00* (2006.01)
  *H01L 21/44* (2006.01)
  *H01L 21/461* (2006.01)
(52) U.S. Cl. .................. 438/72; 438/73; 438/670; 438/748; 257/E31.11; 257/E31.127
(58) Field of Classification Search .......... 438/69, 438/72, 669, 670, 745, 748; 257/E31.11, 257/E31.127
  See application file for complete search history.

(56) References Cited

U.S. PATENT DOCUMENTS

| 4,687,541 | A | * | 8/1987 | Penney ................ 438/670 |
| 5,967,156 | A | * | 10/1999 | Rose et al. ................ 134/7 |
| 6,500,758 | B1 | * | 12/2002 | Bowers ................ 438/669 |
| 6,690,014 | B1 | * | 2/2004 | Gooch et al. ............ 250/338.4 |
| 6,734,516 | B2 | * | 5/2004 | Jacksen et al. ............ 257/431 |
| 2001/0010360 | A1 | * | 8/2001 | Oda ................ 250/338.1 |

OTHER PUBLICATIONS

Bilir et al., Stress and Other Challenges with Evaporated Ni-Cr Thin Film Resistors Used in the Manufacture of ASICs, 2003 GaAs Mantech, Inc. 2003 International Conference on Compound Semiconductor Mfg., 4 pages.

Radulescu et al., Introduction of Complete Sputtering Metallization in Conjuncion with CO2 Snow Lift-Off for High Volume GaAs Manufacturing, 2002 GaAs Mantech, Inc., 2002 International Conference on Compound Semiconductor Mfg., 4 pages.

Redd et al., Revitalization of Single Layer Lift-Off For Finer Resolution and Challenging Topography, 2001 GaAs Mantech, Inc., 2001 International Conference on Compound Semiconductor Mfg., 3 pages.

Miller et al., Innovative Metal Lift-Off Process Using Dry Carbon Dioxide, 2001 GaAs Mantech, Inc., 2001 International Conference on Compound Semiconductor Mfg., 4 pages.

Ryan et al., The evolution of interconnection technology at IBM, IBM Journal of Research and Development, vol. 39, Nov. 4, 1995, 17 pages.

* cited by examiner

*Primary Examiner*—Hsien-ming Lee
*Assistant Examiner*—Kevin Parendo
(74) *Attorney, Agent, or Firm*—Haynes and Boone, LLP

(57) ABSTRACT

A method of fabricating a semiconductor device includes patterning a layer of photoresist onto a surface of a wafer to define metal feature areas and residual metal areas. A layer of metal is deposited over the patterned layer of photoresist, the metal layer includes metal feature portions in the metal feature areas, residual metal areas in the residual metal areas, and residual metal flaps at the edges of the metal feature portions. The wafer is sprayed with high-pressure solvent at a pressure to dissolve the layer of photoresist and to physically remove the residual metal portions from the residual metal areas, leaving only at least a portion of the residual metal flaps. The wafer is sprayed with a stream of frozen gas particles to remove the residual metal flaps.

20 Claims, 4 Drawing Sheets

METAL LIFT-OFF SYSTEMS AND METHODS USING LIQUID SOLVENT AND FROZEN GAS

TECHNICAL FIELD

The present invention relates generally to the manufacture of semiconductor devices, such as for example a microbolometer infrared imaging device, including methods of removing residual metal from metal layers during fabrication of the device.

BACKGROUND

There is a problem in a process of manufacturing a semiconductor device (e.g., a micro-electro mechanical system (MEMS) device) using certain, atypical metals for which no established plasma etch chemistry exists, because removing residual metal from a metal layer during metal patterning may require a lift-off technique. For example, a microbolometer infrared (IR) imager with a focal plane array of individual bolometers may include a number of such metals, for example vanadium oxide or VOx (used as the active material sensitive to the desired IR frequency), vanadium, titanium, NiCr, and or a Ti—NiCr stack. Further complicating matters, these metals may require sputtering for deposition—a method of deposition which has been considered unsuitable for lift-off processing. The unsuitability stems from residual metal artifacts that may remain on an edge of the device pattern, which may result in electrical shorts and reduced device yields.

Lift-off may be performed by immersing the wafers in a solvent bath to dissolve the patterned resist and manually swabbing the wafers to remove any residual metal flaps. This process is thought to be undesirably inefficient for mass production and incompatible with Class 1 conditions and operations of a chip manufacturing facility.

As a result, there is a need for an automated lift-off and metal flap removal method which will remove metal from non-pattern areas and remove metal flaps at the edges of patterned areas without damaging the device (e.g., microbolometer IR imager).

SUMMARY

In accordance with one embodiment of the present invention, a method of fabricating a semiconductor device includes patterning a layer of photoresist onto a surface of a wafer to define metal feature areas and residual metal areas. A layer of metal is deposited over the patterned layer of photoresist, the metal layer comprising metal feature portions in the metal feature areas, residual metal portions in the residual metal areas, and residual metal flaps at the edges of the metal feature portions. The wafer is sprayed with high-pressure solvent to dissolve the layer of photoresist and to physically remove the residual metal portions from the residual metal areas and leaving the residual metal flaps. The wafer is sprayed with a stream of frozen gas particles to remove the residual metal flaps.

In accordance with another embodiment of the present invention, a method of fabricating an infrared imaging device includes patterning a layer of photoresist on a surface of a wafer to define metal feature areas and residual metal areas. The method also includes depositing a layer of metal over the patterned layer of photoresist, the metal layer comprising metal feature portions in the metal feature areas and residual metal in the residual metal areas. The wafer is flooded with a low pressure solvent. The surface of the wafer is sprayed with high-pressure solvent to remove the photoresist and the residual metal from the surface of the wafer. The surface of the wafer is sprayed with a stream of frozen gas particles to remove metal flaps from edges of the metal features. The metal features may include portions of an array of microbolometers.

A method of fabricating an array of microbolometers includes depositing a first layer of photo-resist on a surface of wafer, depositing a second layer of photo-resist, developing the first and second layers of photo-resist to define metal feature areas and residual metal areas. Undercuts form in the first layer of photo-resist at the edges of the metal feature areas. A layer of metal is deposited over the first and second layers of photo-resist, wherein the layer of metal includes residual metal portions in the residual metal areas, metal feature portions in the metal feature areas, and residual flaps in the undercuts. The wafer is flooded in a solvent and the surface of the wafer is sprayed with high-pressure solvent. The flooding and spraying with the solvent substantially removes the first and second layers of photo-resist and the residual metal portions. The surfaces of the wafer are sprayed with a stream of frozen $CO_2$ particles, which removes the residual flaps remaining after the flooding and the spraying with the solvent.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
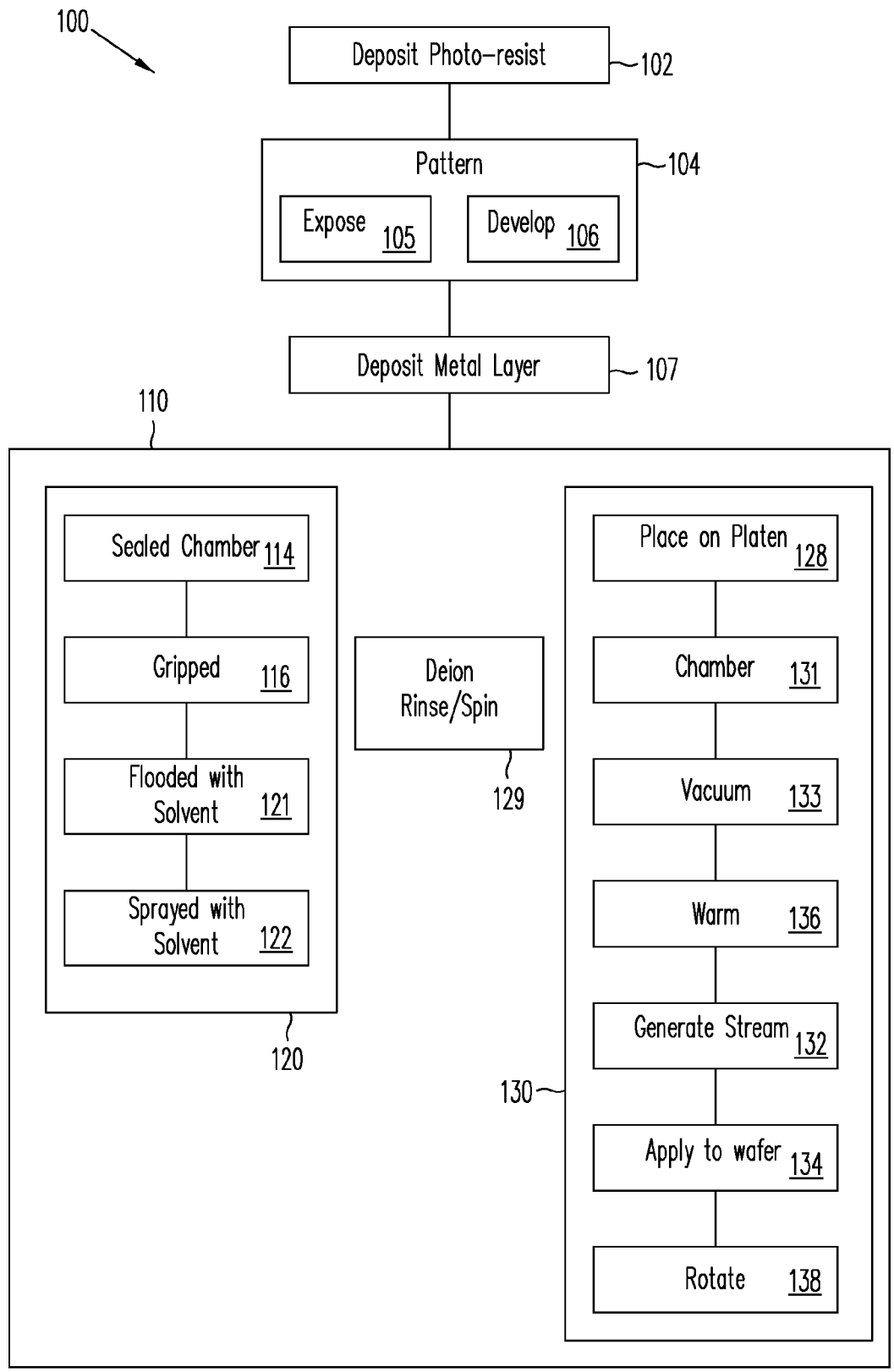
FIG. 1 shows a block diagram illustrating a method of fabricating a semiconductor device in accordance with an embodiment of the present invention.

Systems and methods are disclosed herein, in accordance with one or more embodiments of the present invention, to provide a semiconductor device, such as for example an infrared imaging device (e.g., which may represent a micro-electronic mechanical system (MEMS) device). For example, in accordance with an embodiment of the present invention, FIG. 1 shows a method 100 of fabricating a microbolometer.

The method 100 may include depositing 102 and patterning 104 a photoresist layer on a wafer to define metal feature areas and residual metal areas, depositing 107 a metal layer over the patterned photoresist layer and removing 110 residual metal from the residual metal areas. The metal feature areas defined by the photoresist are areas where deposited metal remains on the wafer to form part of the semiconductor device. The residual metal areas are areas where deposited metal is to be removed from the metal layer, leaving the metal features to form the semiconductor device. The residual metal areas and the metal feature areas may be discontinuous from each other at an edge of the patterned photoresist areas. In an example embodiment, the deposited metal may be a metal for which no standard plasma etch chemistry is known or practical for a desired application, such as for example vanadium oxide (VOx), vanadium, titanium and/or nickel-chrome (Ni-Chrome), aluminum, or other metals.

Depositing 102 and patterning 104 a photoresist may include a two-layer photoresist method. A two-layer depositing 102 and patterning 104 method may include depositing 102 a first layer, depositing 102 a second layer of photoresist, and patterning 104 the photoresist. In an example embodiment, patterning 104 may include exposing 105 and developing 106 the photoresist. Such multi-layer depositing 102 and patterning 104 of a photoresist may create an undercut in the first layer just under the edges of the top layer defining the metal feature areas.

The bottom layer may be a lift-off layer, in other words a photoresist that behaves like exposed (positive) photoresist, even if not exposed. The second layer may be a positive photoresist. Exposing 105 and developing 106 the photoresist may remove the top layer photoresist in the areas of exposure, the bottom layer photoresist exposed to the developer while developing 106 the top layer, and at least some of the bottom layer photoresist along the edges of the of the unexposed top layer and underneath the edges of the unexposed top layer, thus forming undercuts below the top layer. Having an undercut may enhance the discontinuity of the metal layer deposited over the photoresist, thereby improving the ability to lift-off or remove the residual metal.

Figure 5:
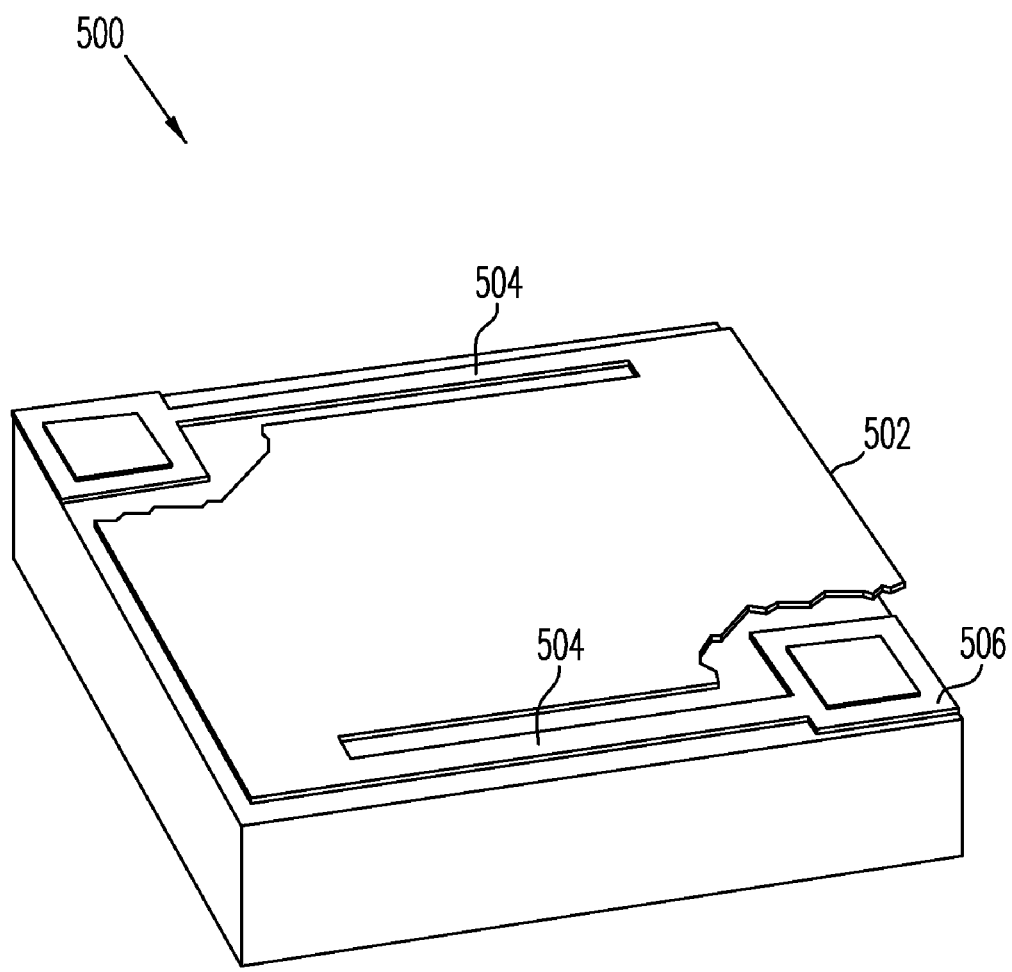
FIG. 5 shows an example of a microbolometer in accordance with an embodiment of the present invention.

In an example embodiment, method 100 of fabricating a semiconductor device may include multiple photoresist patterning 104, metal layer depositing 107, and residual metal removal 110, as desired to form the required layers and/or different portions of the semiconductor device. In the case of a microbolometer fabrication process, for example, method 100 of fabricating the microbolometer device may include forming reflectors, forming leg metal layers, and/or other steps. For example referring briefly to FIG. 5, an exemplary embodiment of a microbolometer 500 is illustrated, which may represent one within an array of microbolometers in an infrared imaging device. The microbolometer may include an elevated microbolometer bridge layer 502, legs 504, and contacts 506. A reflector (not shown) may lie under bridge layer 502, as would be understood by one skilled in the art.

Referring again to FIG. 1, the metal layer may be deposited 107 by sputtering or physical vapor deposition (PVD). Depositing 107 a metal layer may include depositing multiple metal layers in a stack, which may be removed together, for example a Ti—NiCr stack.

Removing 110 the residual metal may include a solvent treatment 120 and a solid/gas spray treatment 130. The solvent treatment 120 may remove a bulk of residual metal and the solid/gas spray treatment 130 may remove remaining residual metal flaps or artifacts.

The solvent treatment 120 may include flooding 121 the wafer with low-pressure solvent and spraying 122 high pressure jets of solvent onto the wafer. In an example embodiment, the flooding 121 and spraying 122 with solvent may be performed using an EQUINOX system available from SEMITOOL.

For flooding 121, the wafer may be placed in a sealed chamber 114, gripped 116, and held upside down. Low pressure solvent, for example 25 psi, may then be flooded 121 into the chamber and onto the wafer. The solvent may be flooded 121 into the chamber through an array or arrays of nozzles. The nozzles may be arranged in a cruciform, or two crossbars of nozzles. In an example embodiment, the solvent may be 1165 Shipley photoresist remover made by Shipley Company.

In accordance with an embodiment of the present invention, a high pressure swing arm may then spray 122 or jet solvent onto the wafer at high pressure. The pressure may be set at, for example, 1400 psi and may be adjusted up to about 2600 psi. The pressure arm may be rotated back and forth across the face of the wafer at 50 RPM, split between the chemical delivery time. In an example embodiment, the arm velocity setting may be 150,000 with an acceleration setting of 5,000—which translates to a linear velocity of about 3 cm/sec. The wafer may be sprayed 122 at a temperature of 70 degrees for up to about 15 minutes. The time may be adjusted as needed, depending on the particular metal or photoresist used, the metal features formed or to be formed, or other application specific conditions or parameters. The spray may be repeated or prolonged as long or as often as necessary to achieve a desired amount of metal removal. In an example embodiment, spraying 120 the wafer may remove a significant portion of the residual metal to be removed including those portions of the residual metal that lie on top of the photoresist layers.

However, spraying 120 alone may leave residual metal flaps on or at the edges of the metal features, for example metal that was deposited onto sidewalls of the photoresist near the edges of the metal feature areas. Therefore, solid/gas spray treatment 130 may be required to sufficiently remove the remaining metal features (e.g., metal flaps), with for example a deionizing rinse/spin 129 between the solvent treatment 120 and the solid/gas spray treatment 130.

For solid/gas spray treatment 130 in accordance with an embodiment, the solid gas spray may include a cryogenic stream of solid particles and gas of a material that is normally in a gaseous state at room temperature. In an example embodiment, the solid/gas spray may include spraying the wafer with a high-pressure, directional jet of solidified gas particles and gas, for example $CO_2$. As an example, the solid/gas spray 130 may be performed using an ECO-SNOW particular $CO_2$ surface treatment tool, although the method is not limited to an ECO-SNOW system.

The solid/gas spray treatment 130 may include generating 132 a stream of high pressure frozen gas particles and gas and then spraying 134 the stream onto the wafer. The solid/gas spray may include solid $CO_2$ (dry ice) particles and $CO_2$ gas. The stream may be generated 132 by spraying liquid carbon dioxide through a nozzle. As the liquid carbon dioxide exits the nozzle, it may cool rapidly, creating a directional stream of $CO_2$ gas and solid $CO_2$ (dry ice) particles. Because this process is similar to the process of blowing artificial snow, the resultant stream of solid gas particles and gas (e.g., provided by the ECO-SNOW system) may be referred to as $CO_2$ "snow".

The wafer may be placed 128 on a platen. The platen may be warmed 136 and may be rotated 138 through 360 degrees. The nozzles may be disposed along a dispensing arm which may have an adjustable raster rate and adjustable distance between passes. When the near cryogenic temperature of the CO2 hits the wafer, the differences in thermal expansion coefficients of the metal and photoresist may cause the metal on any remaining resist to delaminate. The CO2 particles may also chip away at any residual metal flaps. In an example embodiment, the bulk of metal on any photoresist may have been removed by an earlier flood 121 and spray 122 of solvent. Spraying 134 the wafer with CO2 "snow", for example frozen CO2 particles mixed with CO2 gas, may remove residual metal flaps remaining.

The wafer may be warmed 136 to a temperature above room temperature, for example about 60° C. The solid/gas stream may be sprayed or applied 134 onto the wafer at an angle, for example an angle in the range of 10 to 40 degrees with respect to the top surface of the substrate, for example at an angle of 30 degrees.

In an example embodiment, the stream may be sprayed 134 multiple times at different positions. The method may include rotating 138 the wafer to different positions between applications 134. Rotating 138 the wafer to different positions may compensate for the geometry of the structures to be lifted-off. In other words, the particular structures to be formed, and the residual metal areas to be removed, may have residual metal flaps or other structures which may be removed more efficiently from different angles. Prior to applying 134 the stream, the wafer may be placed 131 in a cleaning chamber which may maintain a vacuum 133 during cleaning.

In an example embodiment, the solvent treatment 120 may be performed before the solid/gas spray treatment 130. The solvent treatment 120 alone may remove most of the residual metal, while leaving smaller residual flaps at the edges of the metal features. The solid/gas treatment 130 alone may remove metal more efficiently in more densely patterned areas, while leaving larger, non-patterned areas with larger flaps of metal. First using the solvent treatment 120 and then using the solids/gas treatment 130 may first remove most of the residual metal and the photoresist and then remove residual flaps at the edges of the metal features.

Figure 2A:
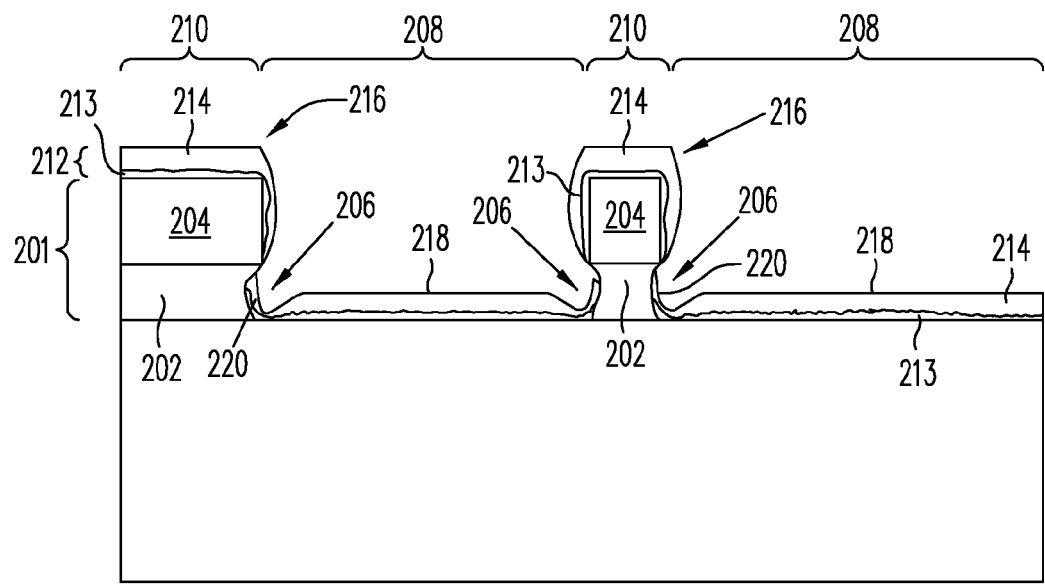
FIGS. 2A-2C show cross-sections of a semiconductor device at various points during fabrication of the semiconductor device in accordance with an embodiment of the present invention.
Figure 2B:
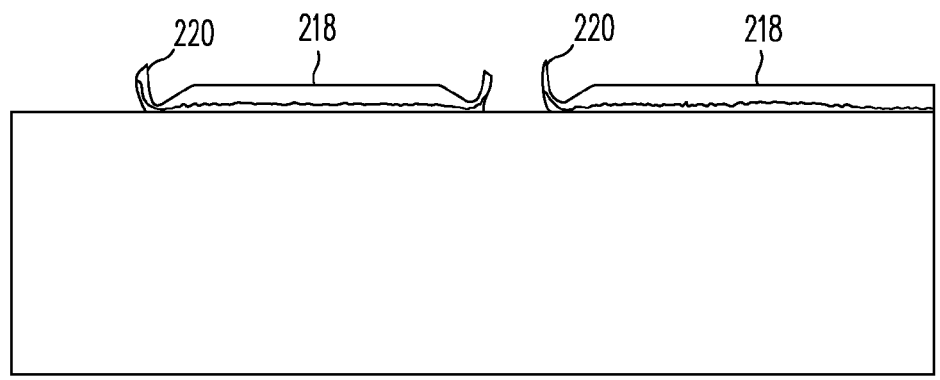
Figure 2C:
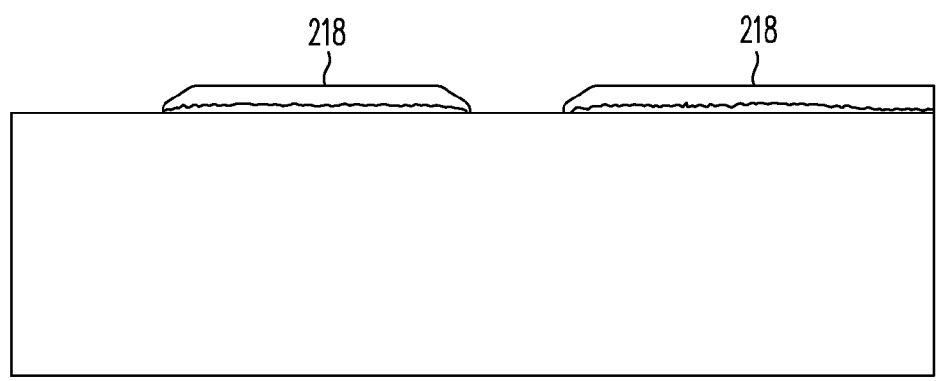

FIGS. 2A-2C illustrate cross-sections of a detail of a semiconductor device 200 during fabrication. FIG. 2A illustrates a cross-section after depositing of the metal layer and before removal of the residual layer and photoresist. A layer of photoresist 201 has been deposited and patterned. The layer 201 may include a first layer 202 (e.g., lift off layer) and a second layer 204. The first layer 202 has been deposited and patterned and the second layer 204 has been deposited over the first layer and patterned, which may cause an undercut 206 to form. The undercut 206 may result in the bulk of the residual metal to be more discontinuous from a desired metal feature 218.

The patterned photoresist layer 201 defines metal feature areas 208 and residual metal areas 210. A metal layer 212 has been deposited over the patterned photoresist layer 201. The metal layer 212 may include a number of metal layers 213, 214, for example a Ti—NiCR stack. The metal layer 212 includes residual metal 216 and metal features 218. The residual metal 216 includes the residual metal 216 on top of the photoresist layer 201 and the residual metal flaps 220 at the edges of the metal features 218. The residual metal flaps 220 may form where metal accumulated along the vertical sidewalls of photoresist layer 201 are connected to the metal feature 218, for example in the undercut areas 206 where metal may accumulate on the sidewalls of the first photoresist layer 201.

FIG. 2B illustrates a cross-section after the solvent treatment 120 and before the CO2 particle spray treatment 130. Residual metal 216 in the residual metal areas 210 have been lifted off, along with the photoresist layers 202, 204. In an example embodiment, there may be some portion of residual metal flaps 220 or artifacts remaining at edges of the metal features 218. The flaps 220 may be removed during the solid/gas treatment 130, resulting in only the desired metal features 218 remaining, as shown in FIG. 2C.

Figure 3A:
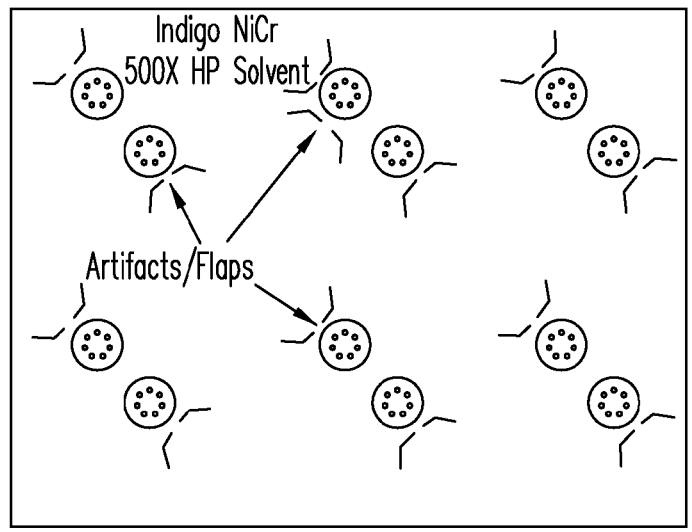
FIGS. 3A and 3B illustrate drawings based on dark field microscope images of a semiconductor device during fabrication of the semiconductor device in accordance with an embodiment of the present invention.
Figure 3B:
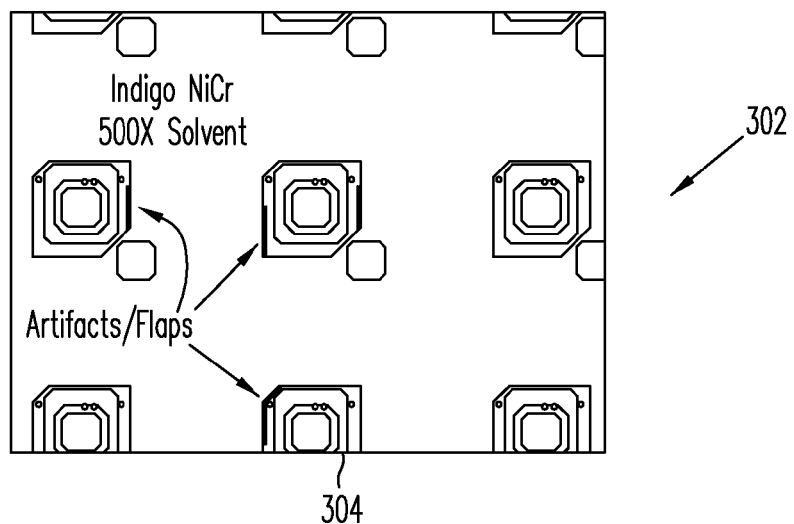

FIGS. 3A and 3B illustrate drawings based on overhead dark field microscope images of artifacts or flaps 220 formed at the edges of metal features of a semiconductor device (e.g., MEMS device, such as represented by a microbolometer) during fabrication. In a dark field microscope image, flat features are dark, whereas vertical features appear bright. In the drawings of FIGS. 3A and 3B, the image features shown are reversed for convenience, so that the flat features appear bright and the vertical features appear dark. The curved artifacts 220 in FIG. 3A are flaps formed at the edge of metal leg features of a microbolometer. The image was made after a solvent treatment 120 and before a solid/gas spray treatment 130. FIG. 3B is an illustration based on a dark field microscope image of an array 302 of reflectors 304 for use in a microbolometer IR imaging device. Artifacts or flaps 220 have formed at the edges of the reflector metal features. The image was made after a solvent treatment 120 and before a solid/gas spray treatment.

Figure 4:
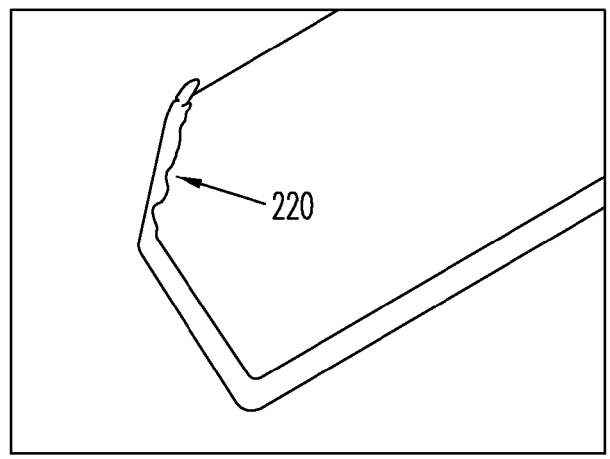
FIG. 4 illustrates a drawing based on a scanning electron microscope (SEM) photograph of a detail of a semiconductor device during fabrication in accordance with an embodiment of the present invention.

FIG. 4 is an illustration based on a scanning electron microscope image of a leg metal feature of a microbolometer. As illustrated, artifacts 220 (e.g., metal flaps) stick up and may overhang at the edges of the leg feature.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A method of fabricating a semiconductor device comprising:
   patterning a layer of photoresist onto a surface of a wafer to define metal feature areas and residual metal areas;
   depositing a metal layer over the patterned layer of photoresist, the metal layer comprising metal feature portions in the metal feature areas, residual metal portions in the residual metal areas, and residual metal flaps at edges of the metal feature portions, wherein the metal feature portions include legs of a microbolometer array;
   spraying the wafer with a high-pressure solvent to dissolve the layer of photoresist and to physically remove the residual metal portions from the residual metal areas and leaving at least a portion of the residual metal flaps;
   securing the wafer on a platen that can be rotated to at least a first position and a second position; and
   spraying the wafer, while the platen is at the first position and then at the second position, with a stream of frozen gas particles to remove the residual metal flaps.

2. The method of claim 1, wherein the metal feature portions comprise reflectors of the microbolometer array.

3. The method of claim 2, wherein the metal layer comprises a Ti—NiCr stack.

4. The method of claim 1, wherein the metal layer comprises titanium.

5. The method of claim 1, wherein the spraying the wafer with the high-pressure solvent is at a pressure in excess of 1000 psi prior to the spraying the wafer with the stream of frozen gas particles.

6. The method of claim 1, further comprising flooding the wafer with a low-pressure solvent prior to the spraying the wafer with the high-pressure solvent and the spraying the wafer with the stream of frozen gas particles.

7. The method of claim 6, wherein the spraying the wafer with the high-pressure solvent occurs for at least fifteen minutes, and wherein the low-pressure solvent is at a pressure of about 25 psi.

8. The method of claim 1, wherein the platen is configured to be rotated through 360 degrees.

9. The method of claim 8, further comprising rotating the wafer through third and fourth positions and wherein the spraying the wafer with the stream of frozen gas particles occurs at the third position and then at the fourth position.

10. A method of fabricating an infrared imaging device, comprising:

patterning a layer of photoresist on a surface of a wafer to define metal feature areas and residual metal areas;
 depositing a metal layer over the patterned layer of photo-resist, the metal layer comprising metal feature portions in the metal feature areas and residual metal in the residual metal areas;
 flooding the wafer with a low-pressure solvent;
 spraying the surface of the wafer with a high-pressure solvent to remove the photoresist and the residual metal from the surface of the wafer;
 securing the wafer on a platen that can be rotated to at least a first position and a second position;
 spraying the surface of the wafer with a stream of frozen gas particles, with the wafer on the platen in the first position, to remove metal flaps from edges of the metal feature portions;
 rotating the platen to the second position; and
 spraying the surface of the wafer with a second stream of frozen gas particles, with the wafer on the platen in the second position, to remove metal flaps from edges of the metal feature portions;
 wherein the metal feature portions comprise reflectors of an array of microbolometers.

11. The method of claim 10, wherein the metal layer comprises a Ti—NiCr stack.

12. The method of claim 10, wherein the metal feature portions comprise legs of a microbolometer array.

13. The method of claim 12, wherein the metal layer comprises titanium.

14. The method of claim 10, wherein the flooding the wafer with the low-pressure solvent is at about 25 psi and is prior to the spraying the wafer with the high-pressure solvent in excess of 1000 psi and the spraying the wafer with the stream of frozen gas particles, and wherein the frozen gas particles comprise $CO_2$.

15. The method of claim 10, wherein the spraying the wafer with the high-pressure solvent is for at least fifteen minutes.

16. The method of claim 10, wherein the platen is configured to be rotated through 360 degrees.

17. The method of claim 16, further comprising rotating the wafer through two additional positions and spraying the surface of the wafer further with corresponding streams of the frozen gas particles at each of the additional positions.

18. A method of fabricating an array of microbolometers comprising:

depositing a first layer of photo-resist on a surface of a wafer;
 depositing a second layer of photo-resist on the wafer;
 developing the first and second layers of photo-resist to define metal feature areas and residual metal areas, wherein undercuts form in the first layer of photo-resist at edges of the metal feature areas;
 depositing a layer of metal over the first and second layers of photo-resist, wherein the layer of metal comprises residual metal portions in the residual metal areas, metal feature portions in the metal feature areas, and residual flaps in the undercuts, wherein the metal feature portions include legs of the array of microbolometers;
 flooding the wafer in a solvent and spraying the surface of the wafer with a high-pressure solvent, wherein the flooding with the solvent and the spraying with the high-pressure solvent removes the first and second layers of photo-resist and the residual metal portions;
 positioning the wafer in a plurality of orientations; and
 spraying the surface of the wafer with a stream of frozen $CO_2$ particles while the wafer is in each of the orientations, wherein the spraying with the stream of frozen $CO_2$ particles removes the residual flaps remaining after the flooding with the solvent and the spraying with the high-pressure solvent.

19. The method of claim 18, wherein the metal feature portions comprise reflectors of the array of microbolometers.

20. The method of claim 19, wherein the layer of metal comprises a Ti—NiCr stack, and wherein the spraying the wafer with the high-pressure solvent is at a pressure in excess of 1000 psi.

* * * * *